(12) United States Patent  (10) Patent No.: US 8,710,681 B2
Chang et al.  (45) Date of Patent: Apr. 29, 2014

(54) ISOLATION RINGS FOR BLOCKING THE INTERFACE BETWEEN PACKAGE COMPONENTS AND THE RESPECTIVE MOLDING COMPOUND

(75) Inventors: Chih-Horng Chang, Taipei (TW); Tin-Hao Kuo, Hsin-Chu (TW); Tsung-Fu Tsai, Changhua (TW); Min-Feng Ku, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/485,527

(22) Filed: May 31, 2012

(65) Prior Publication Data

US 2013/0320572 A1 Dec. 5, 2013

(51) Int. Cl.
*H01L 33/62* (2010.01)
*H01L 33/52* (2010.01)
*H01L 23/48* (2006.01)

(52) U.S. Cl.
USPC .............. 257/787; 257/E33.059; 257/E23.01; 257/788; 257/791; 257/782; 257/786; 257/784; 257/778; 257/737; 257/738; 257/692; 257/693; 257/773; 257/774; 257/668

(58) Field of Classification Search
USPC ......... 257/787, 788, 789, 791, 782, 786, 784, 257/778, 737, 738, 734, 692, 693, 773, 774, 257/668, E33.059, 98, E23.01
See application file for complete search history.

(56) References Cited

U.S. PATENT DOCUMENTS

| 5,053,378 | A | 10/1991 | Blanchard et al. | |
| 5,173,766 | A * | 12/1992 | Long et al. | 257/687 |
| 7,629,660 | B2 * | 12/2009 | Bauer et al. | 257/433 |
| 8,169,083 | B2 * | 5/2012 | Igarashi | 257/778 |
| 8,418,358 | B2 * | 4/2013 | Wada | 29/841 |
| 2003/0227025 | A1 * | 12/2003 | Ochi et al. | 257/100 |
| 2008/0251946 | A1 * | 10/2008 | Seko | 257/782 |
| 2009/0001606 | A1 * | 1/2009 | Tamadate | 257/778 |
| 2009/0163615 | A1 | 6/2009 | Halahmi et al. | |
| 2009/0323162 | A1 * | 12/2009 | Fanton et al. | 359/275 |

* cited by examiner

*Primary Examiner* — Alexander Oscar Williams
(74) *Attorney, Agent, or Firm* — Slater & Matsil, L.L.P.

(57) ABSTRACT

A device includes a first package component, and a second package component underlying, and bonded to, the first package component. A molding material is disposed under the first package component and molded to the first and the second package components, wherein the molding material and the first package component form an interface. An isolation region includes a first edge, wherein the first edge of the isolation region contacts a first edge of the first package component and a first edge of the molding material. The isolation has a bottom lower than the interface.

20 Claims, 12 Drawing Sheets

ISOLATION RINGS FOR BLOCKING THE INTERFACE BETWEEN PACKAGE COMPONENTS AND THE RESPECTIVE MOLDING COMPOUND

BACKGROUND

In the packaging of integrated circuits, device dies are bonded onto package components such as package substrates in a package substrate strip. The package substrates include metal connections that are used to route electrical signals between opposite sides of the respective package substrates. The dies may be bonded onto one side of a package substrate strip using flip chip bonding, and a reflow is performed to melt the solder balls that interconnect the dies and the package substrates.

After the bonding of the device dies onto the package substrate strip, a molding compound is molded onto the device dies and the package substrate strip. The package substrate strip is then sawed apart into a plurality of packages. Although the molding materials are generally moisture proof, the moisture may still penetrate into the resulting packages.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 5B are top views and cross-sectional views of intermediate stages in the formation of packages in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package and a method of forming the same are provided in accordance with various exemplary embodiments. The intermediate stages of forming the package are illustrated. The variations of the embodiments are discussed. Throughout various views and illustrative embodiments, like reference numbers are used to designate like elements.

Figure 1:
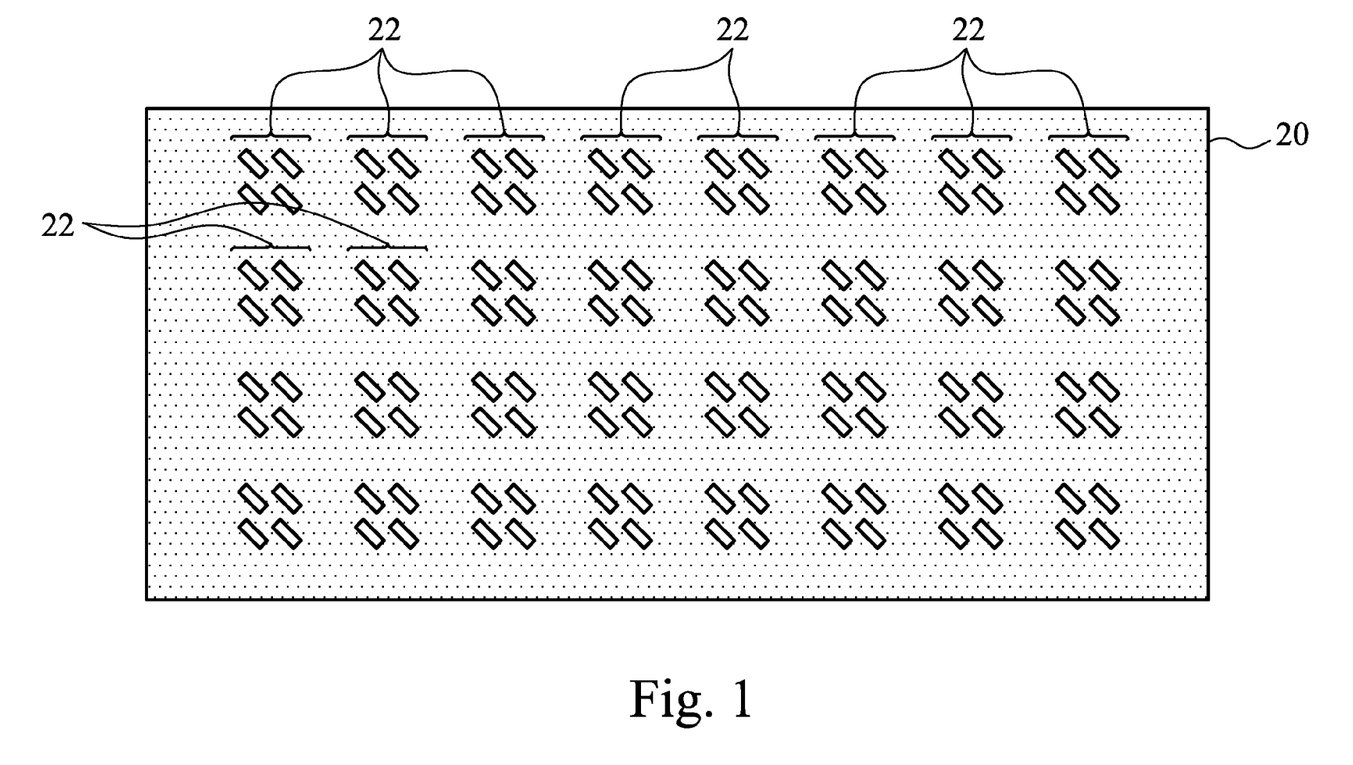

FIG. 1 illustrates a top view of a package component 20. In some embodiments, package component 20 is a package substrate strip, and hence is referred to as package substrate strip 20 hereinafter, although package component 20 may also be another type of package component such as an interposer wafer, a device wafer, or the like. In the embodiments wherein package component 20 is a package substrate strip, package substrate strip 20 includes a plurality of package substrates 22, which are identical to each other. In some embodiments, package substrates 22 are distributed uniformly in one or both of the illustrated X and Y directions, and may have the layout of an array.

Package substrates 22 may be laminate substrates, which include a plurality of dielectric films 23 (shown in FIG. 2B) adhered together through lamination, or may be build-up substrates. Dielectric films may comprise composite materials that are mixed with glass fiber and/or resin. Metal traces 28 and vias 30 (FIG. 2B) are formed in laminate dielectric films 23. As also shown in FIG. 2B, electrical connectors 24 are formed on a surface of package substrates 22, and are connected to electrical connectors 26 that are on the opposite side of the respective package substrate 22 through metal traces 28. In some embodiments, electrical connectors 24 are metal traces, which are used for forming Bump-On-Trace (BOT) connections. In alternative embodiments, electrical connectors 24 are metal pads, metal pillars, composite connectors comprising metal pillars and solder caps, or the like.

Figure 2A:
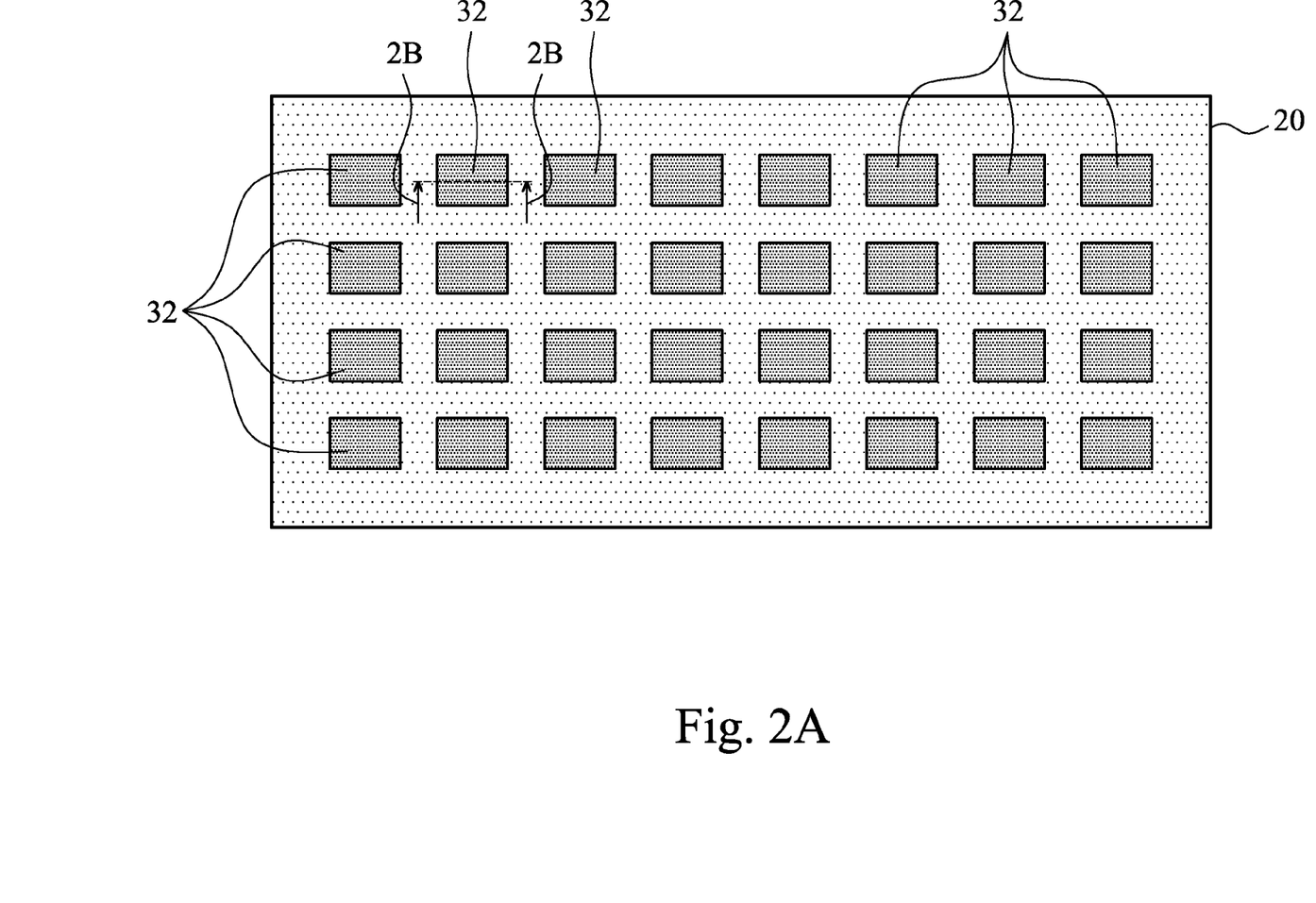
Figure 2B:
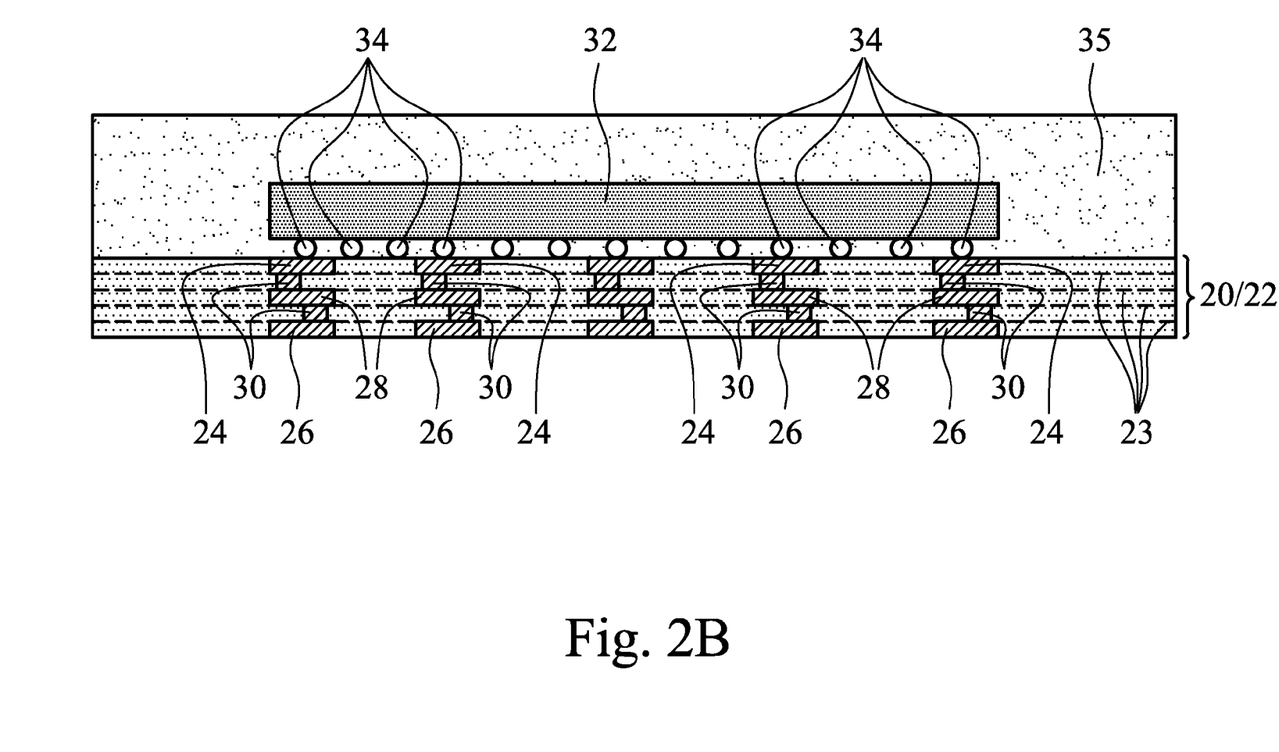

FIG. 2A illustrates a top view showing the bonding of package components 32 onto package substrates 22 in FIG. 1. FIG. 2B illustrates a cross-sectional view of FIG. 2A, wherein the cross-sectional view is obtained from the plane crossing line 2B-2B in FIG. 2A. In some embodiments, package components 32 are dies (such as device dies comprising transistors), packages, or the like. Referring to FIG. 2B, the bonding may be performed through solder bonding, wherein electrical connectors 34 of package components 32 are solder balls. In some exemplary embodiments, the bonding is a BOT bonding.

As also shown in FIG. 2B, after the bonding of package components 32 onto package substrates 22, polymer 35 is dispensed to mold package components 32 and package substrates 22. In some embodiments, polymer 35 is a molding compound, a molding underfill, an epoxy, or the like. An underfill (not shown) may be dispensed into the gaps between package components 32 and package substrates 22. Alternatively, no underfill is dispensed. Instead, polymer 35 is a molding underfill that is also disposed into the gaps besides molding package components 32. Polymer 35 is then cured and solidified.

Figure 3A:
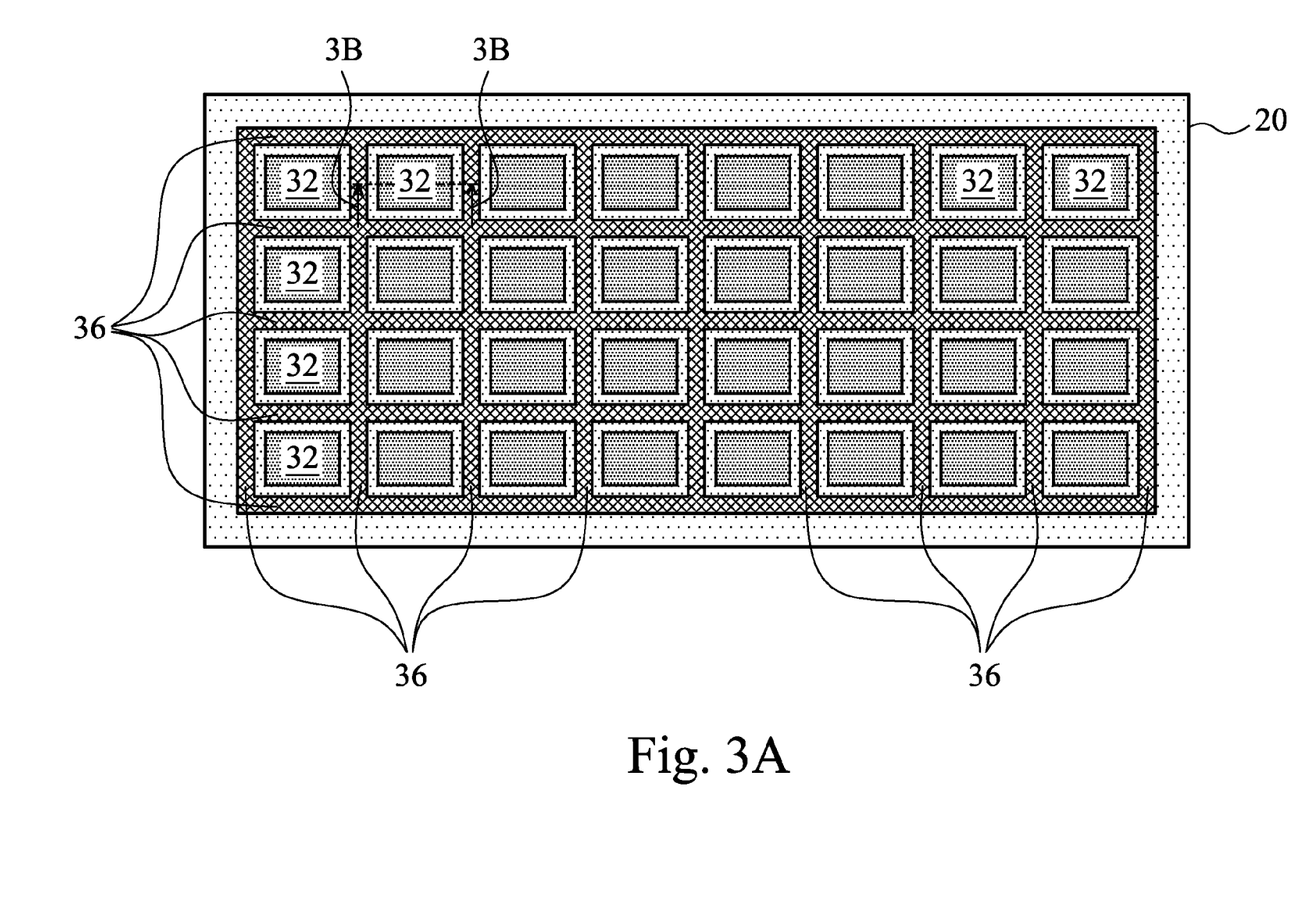
Figure 3B:
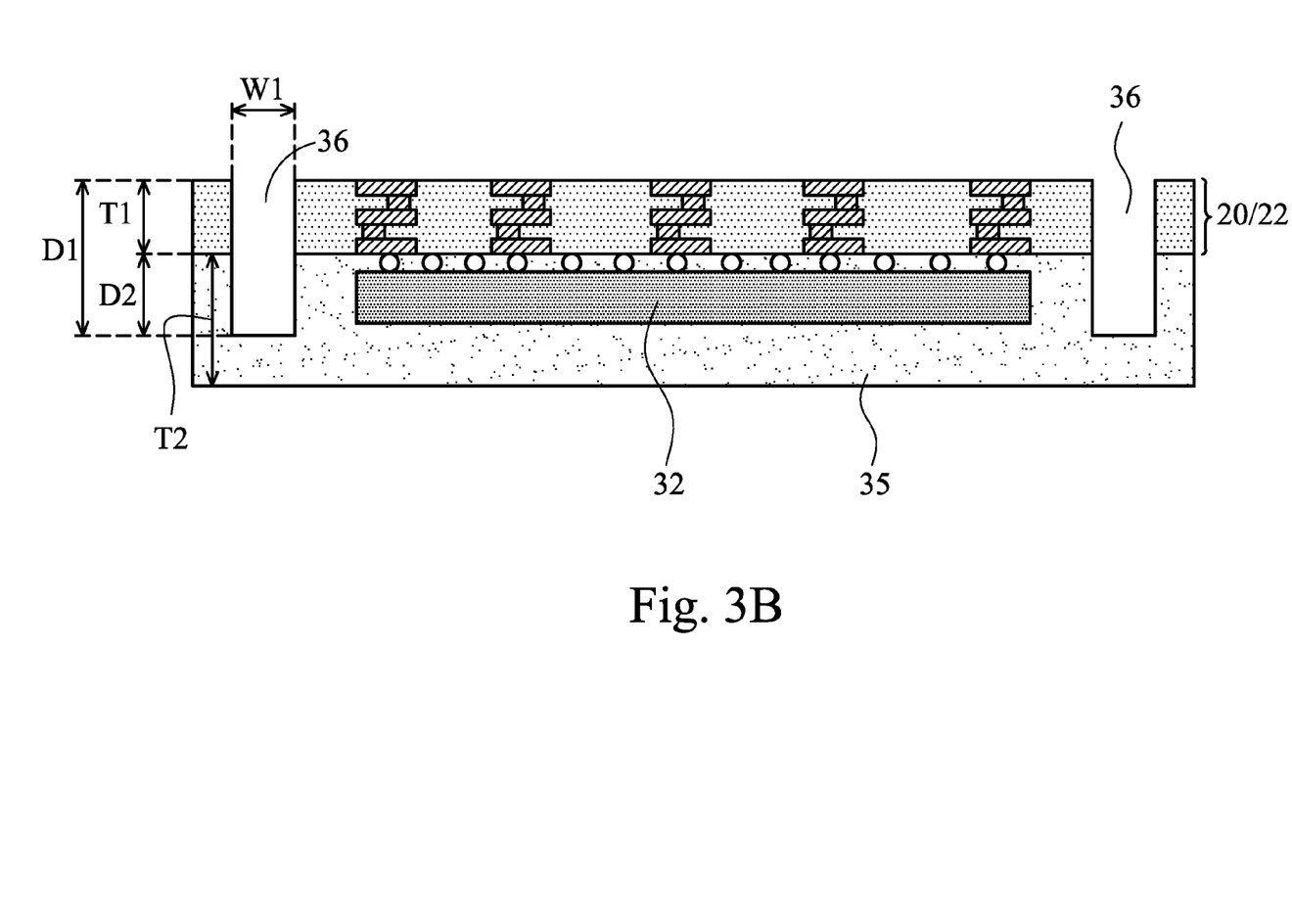

Referring to FIGS. 3A and 3B, a grooving is performed on package substrate strip 20 to form trenches 36. The grooving may be performed using a blade, a laser beam, or the like. Referring to FIG. 3A, trenches 36 are formed between package substrates 22, and separate package substrates 22 from each other. Trenches 36 may form a grid. FIG. 3B illustrates a cross-sectional view of the structure shown in FIG. 3A, wherein the cross-sectional view is obtained from the plane crossing line 3B-3B in FIG. 3A. As shown in FIG. 3B, trenches 36 penetrate through package substrate strip 20, extend into polymer 35, and stop at an intermediate level of polymer 35. Accordingly, depth D1 of trenches 36 is at least greater than thickness T1 of package substrate strip 20. Furthermore, depth D2, which is the depth of the portions of trenches 36 in polymer 35, may be greater than about 20 percent thickness T2 of polymer 35, and may be between about 20 percent and about 80 percent thickness T2. Width W1 of trenches 36 may be between about 1,000 μm and about 5,000 μm.

Figure 4A:
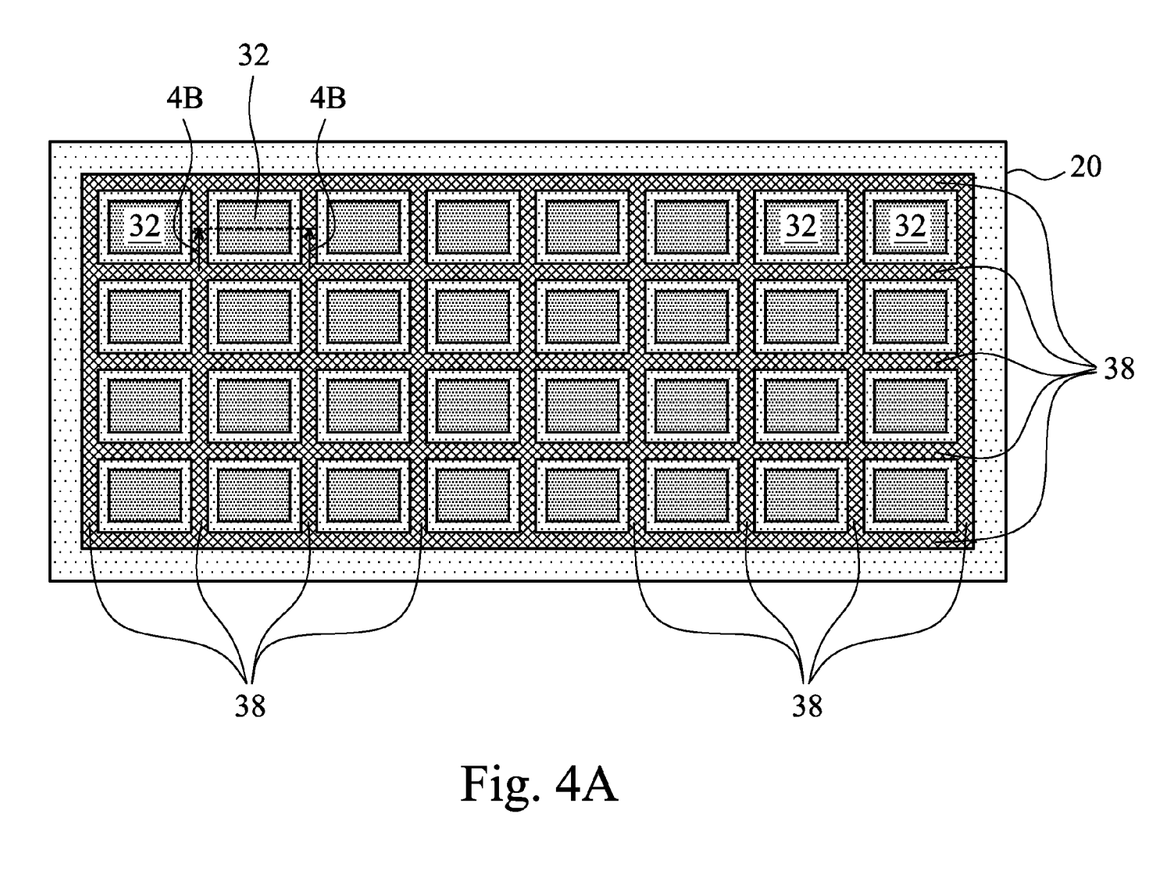
Figure 4B:
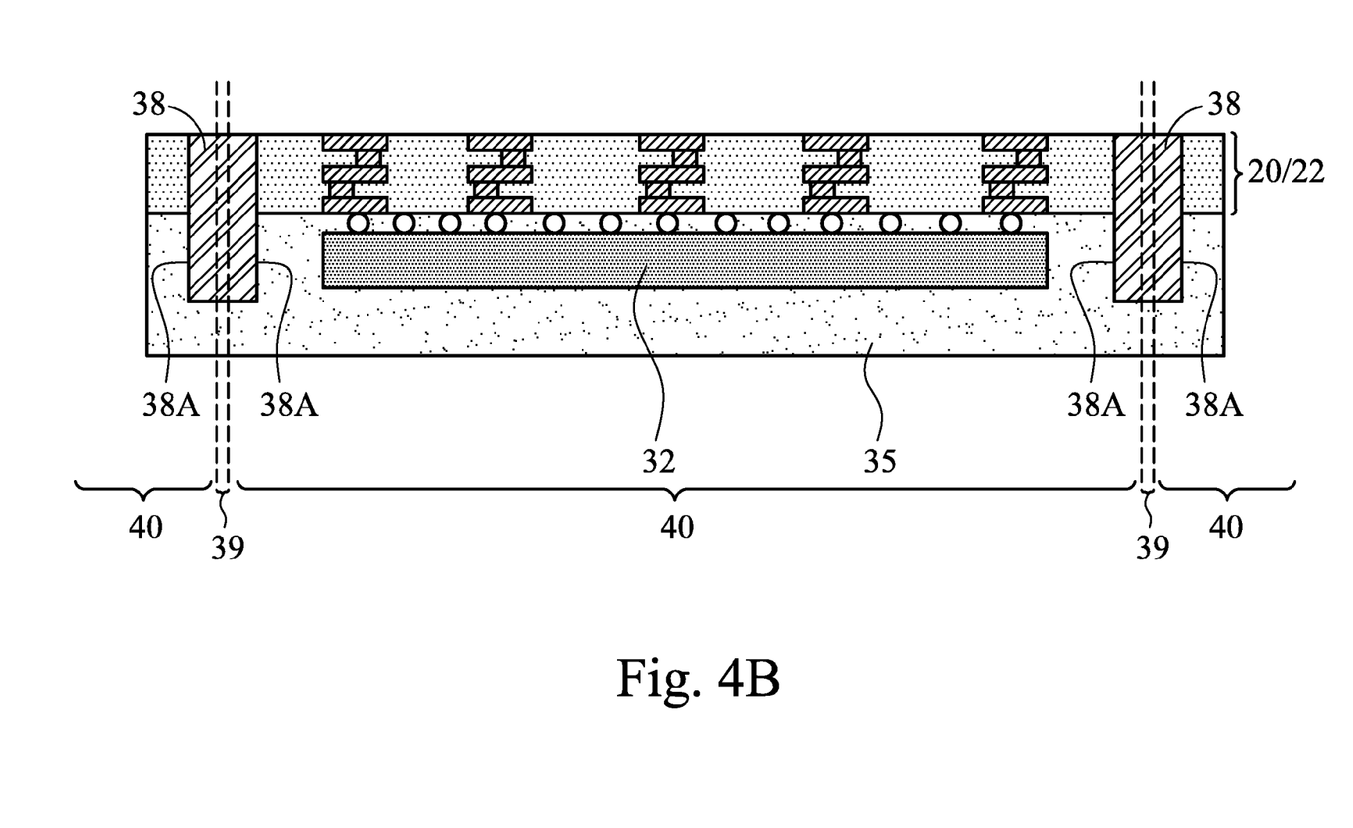
Figure 5A:
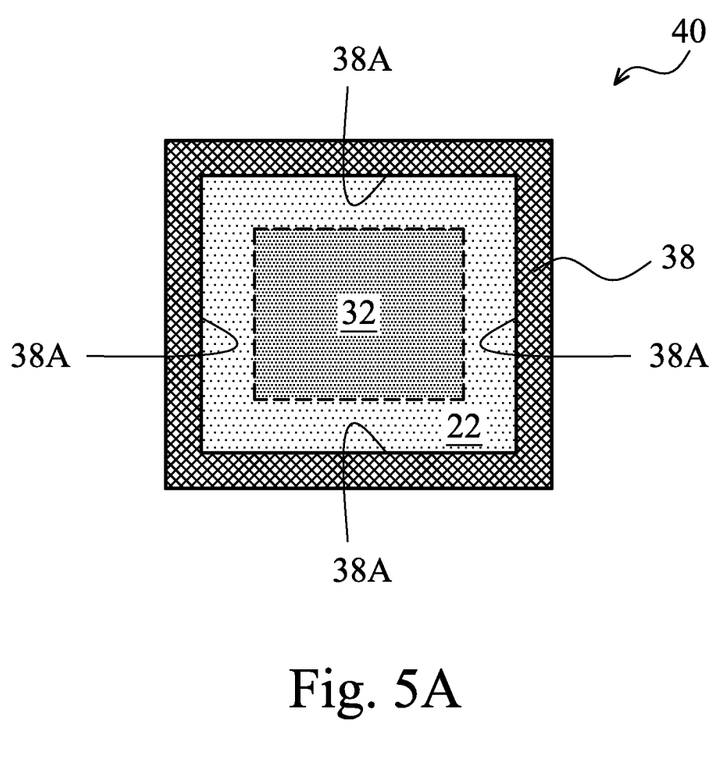
Figure 5B:
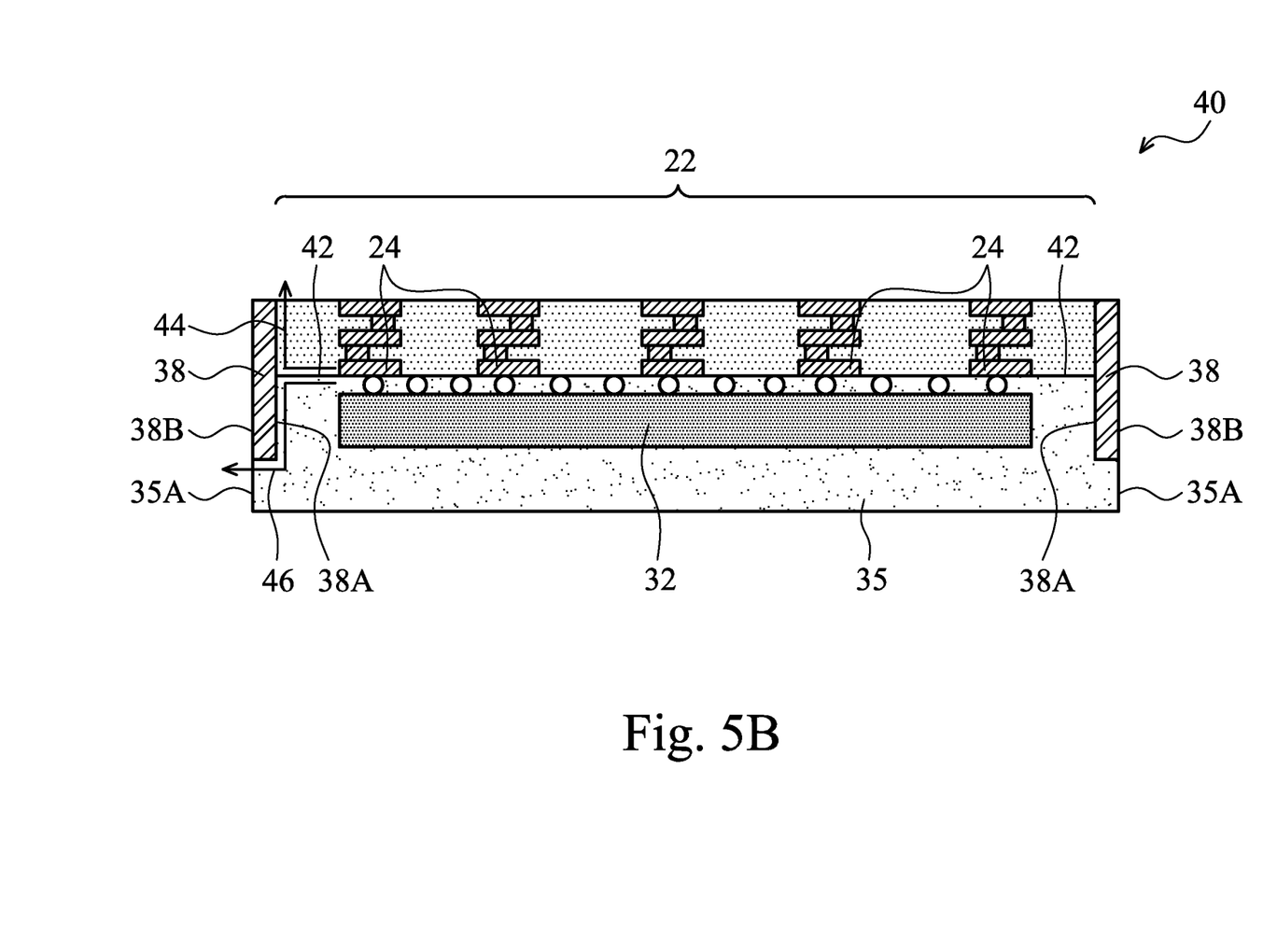

An isolation material is filled into trenches 36, and is cured (solidified) to form isolation regions 38. The resulting structure is shown in FIGS. 4A and 4B. FIG. 4B illustrates a cross-sectional view of the structure shown in FIG. 4A, wherein the cross-sectional view in FIG. 4B is obtained from the plane crossing line 4B-4B in FIG. 4A. The top surface of isolation regions 38 may be slightly higher than, substantially level with, or lower than, the top surfaces of package substrates 22. When filled into trenches 36, isolation material 38 may be a liquid or a gel, which has a viscosity low enough to fill into the micro-voids (not shown) in polymer 35 (FIG. 5B). Isolation regions 38 may be a polymer, a resin, or the like. In some exemplary embodiments, isolation material 38 is a solder resist such as comprising Alkyd resin, acrylated epoxy resin, methacrylated epoxy resin, or the like. After the curing, isolation regions 38 may have a density greater than the density of the cured polymer 35 in accordance with some embodiments. For example, the ratio of the density of isolation regions 38 to the density of polymer 35 may be greater than about 3 volume percent. The ratio of the density of isolation regions 38 to the density of polymer 35 may be between about 97 volume percent and about 100 volume percent in accordance with some embodiments. The dispensing of the isolation material may be performed, for example, through stencil printing.

Next, as also shown in FIG. 4B, a die saw is performed to saw the structure in FIGS. 4A and 4B into a plurality of packages 40. Kerf lines 39 are between opposite edges 38A of isolation regions 38. After the die sawing, there are remaining portions of isolation regions 38 on opposite sides of kerf lines 39. FIGS. 5A and 5B illustrate a top view and a cross-sectional view, respectively, of package 40. As shown in FIG. 5A, isolation regions 38 are located at the peripheral region of package 40. It is appreciated that although isolation regions 38 are referred to using a plural form, isolation regions 38 may be parts of a same continuous ring, as shown in FIG. 5A. The inner edges 38A of isolation regions 38 are in contact with the edges of package component 22.

Referring to FIG. 5B, outer edges 38B of isolation regions 38 also act as the edges of package 40. Outer edges 38B are aligned to edges 35A of polymer 35. Inner edges 38A of isolation regions 38 are opposite to outer edges 38B, and are in contact with both package substrate 22 and polymer 35. Furthermore, inner edges 38A are in contact with interface 42 between polymer 35 and package substrate 22.

In some embodiments, isolation regions 38 form a ring encircling and contacting interface 42. Interface 42 is likely to be the weak part in which moisture and detrimental chemical gases may pass through. For example, the moisture may travel from open air, through interface 42, and reach the internal features such as electrical connectors 24. It is realized that the resistance to the penetration of the moisture increases when the length of the traveling path of the moisture increases. Accordingly, as shown in FIG. 5B, assuming if isolation regions 38 are not formed, moisture may travel from open air to electrical connectors 24 through paths 45. When isolation regions 38 are formed, moisture may travel from open air to electrical connectors 24 through paths 44, which are longer than paths 45. Since paths 44 are longer than paths 45, the resulting package 40 has increased resistance to the penetration of moisture and the detrimental chemical gases than in structures that do not have isolation regions 38. As a result, since electrical connectors suffer less from the moisture and detrimental chemicals, the risk of short circuits between neighboring electrical connectors 24 is reduced. For example, the short circuits may be the result of the formation of dendrites between neighboring electrical connectors 24, and the undesirable dendrites may further be formed due to the oxidation of metal ions of electrical connectors 24, the migration of the oxidized metal ions along interface 42, and the reduction of the migrated metal ions.

Figure 6:
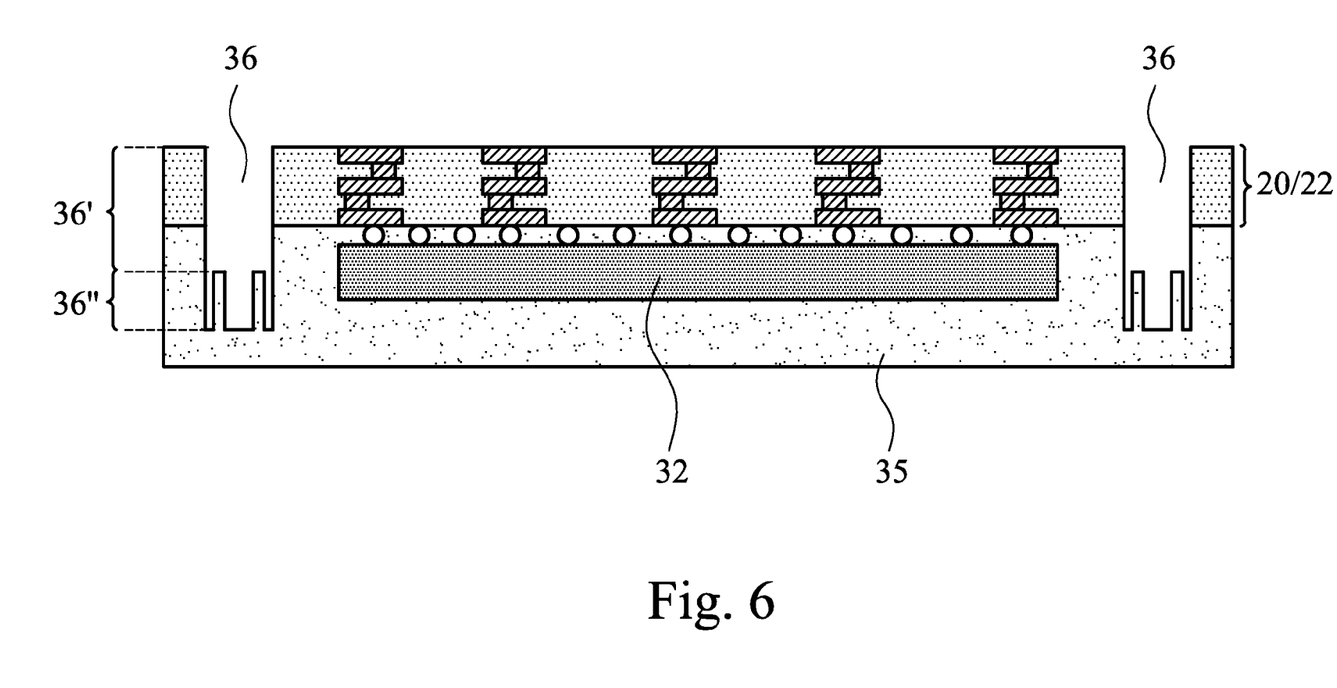
FIGS. 6 through 8 illustrate the formation of packages in accordance with some alternative exemplary embodiments.
Figure 7:
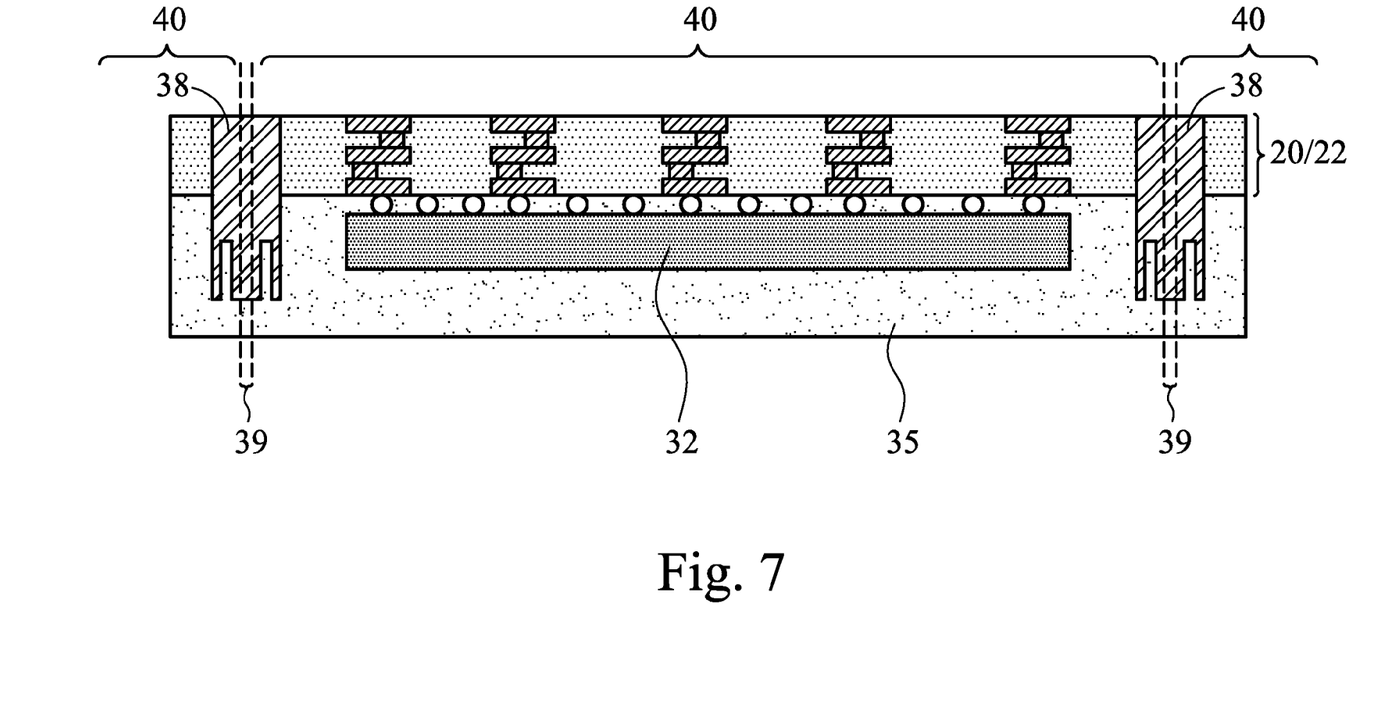

FIGS. 6 and 7 illustrate the formation of package 40 in accordance with alternative embodiments. In FIG. 6, trenches 36 include wide portions 36' and narrow portions 36", which are narrower than wide portions 36'. In the formation of trenches 36, wide portions 36' are first formed, wherein wide portions 36' may extend from the top surface of package substrate 22 into polymer 35. Wide portions 36' may form a grid since wide trenches 36' are parts of trenches 36, which forms a grid, as shown in FIG. 3A. Next, a plurality of narrow trenches 36" is formed to extend from the bottom of wide portions 36' deeper into polymer 35. Next, as shown in FIG. 7, isolation material 38 is dispensed into trenches 36 to form isolation regions 38, which also include wide portions and narrow portions. A die saw step is then performed to cut package substrate strip 20, isolation regions 38, and polymer 35 into packages 40. The respective kerf lines 39 of the sawing are illustrated.

Figure 8:
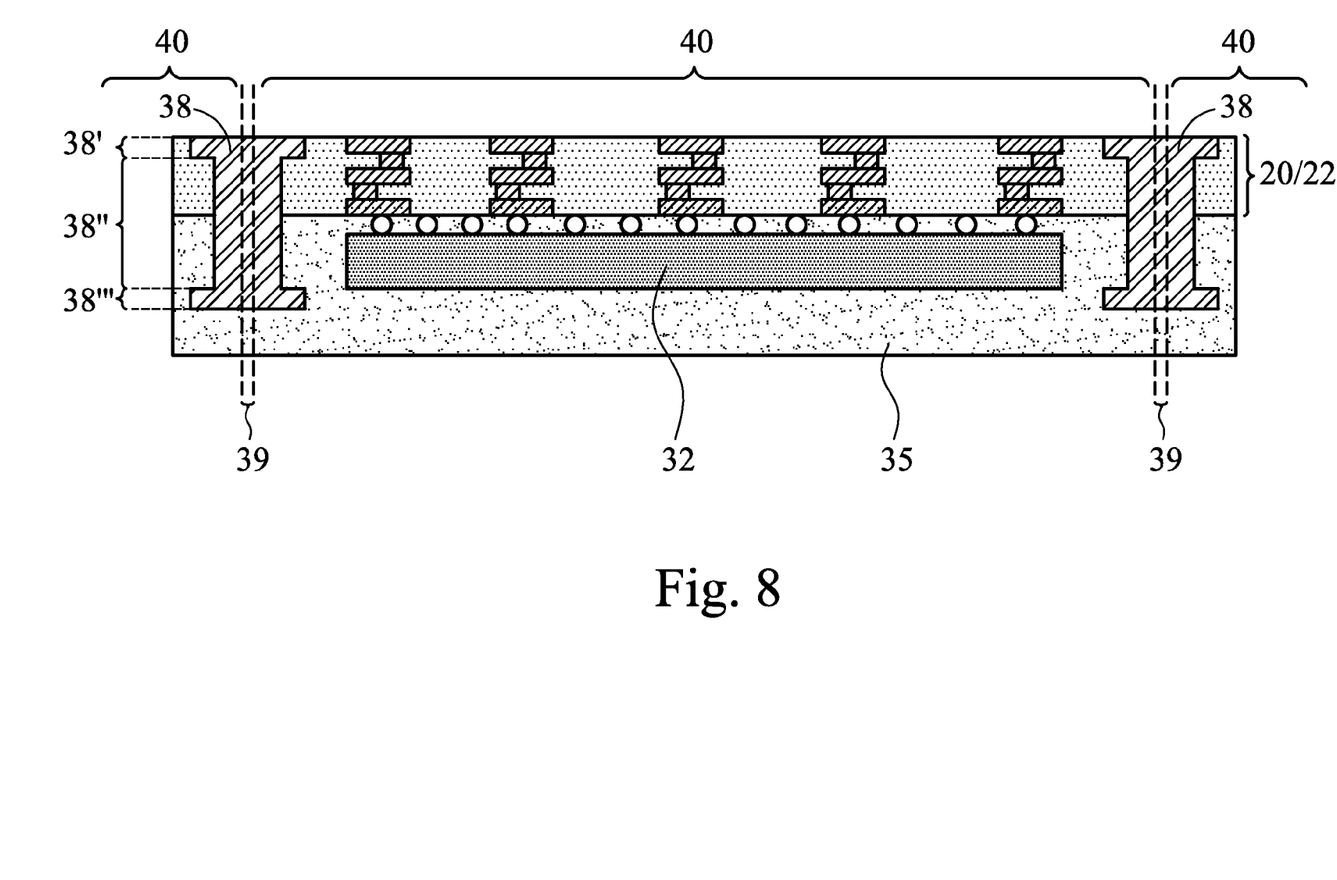

FIG. 8 illustrates the formation of package 40 in accordance with further embodiments. In these embodiments, isolation regions 38 include wide portions 38', narrow portions 38", and additional wide portions 38'''. In the formation of the trench of isolation regions 38, the trenches for forming portions 38' and 38" may be formed before the sawing of package substrate strip 20, and the trenches for forming portions 38''' may be formed after the sawing. The filling of the isolation material 38 may be performed after the die saw.

In accordance with embodiments, a device includes a first package component, and a second package component underlying, and bonded to, the first package component. A molding material is disposed under the first package component and molded to the first and the second package components, wherein the molding material and the first package component form an interface. An isolation region includes a first edge, wherein the first edge of the isolation region contacts a first edge of the first package component and a first edge of the molding material. The isolation has a bottom lower than the interface.

In accordance with other embodiments, a device includes a package substrate, and a device die underlying, and bonded to, the package substrate. A molding compound is disposed under the package substrate and molded to the package substrate and the device die. A polymer encircles the package substrate and contacts edges of the package substrate. The polymer extends from a top surface of the package substrate to a level lower than a top surface of the molding compound.

In accordance with yet other embodiments, a method includes bonding a first package component to a second package component, molding a molding material to the first and the second package components, and forming a trench penetrating through the first package component. The trench extends into the molding material. An isolation material is filled into the trench to form an isolation region. The isolation region and the molding material are sawed to form a package, wherein the package includes a portion of the isolation region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a first package component:
   a second package component underlying, and bonded to, the first package component;
   a molding material under the first package component and molded to the first and the second package components, wherein the molding material and the first package component form an interface; and
   an isolation region comprising a first edge, wherein the first edge of the isolation region contacts a first edge of the first package component and a first edge of the molding material, and wherein the isolation region has a bottom lower than the interface.

2. The device of claim 1, wherein the first package component, the second package component, and the molding material form a package, and wherein a second edge of the isolation region and a second edge of the molding material form an edge of the package.

3. The device of claim 1, wherein the isolation region forms a ring encircling the first package component.

4. The device of claim 1, wherein the isolation region comprises four inner edges contacting four edges of the first package component.

5. The device of claim 1, wherein the first package component is a laminate substrate, and wherein the molding material comprises a molding compound.

6. The device of claim 1, wherein the isolation region comprises:
   a wide portion extending from a top surface of the first package component into the molding material, wherein the bottom of the isolation region is a bottom of the wide portion; and
   a narrow portion narrower than the wide portion, wherein the narrow portion extends from the bottom of the wide portion further into the molding material.

7. The device of claim 1, wherein the isolation region comprises a solder resist.

8. A device comprising:
   a package substrate;
   a device die underlying, and bonded to, the package substrate;
   a molding compound under the package substrate and molded to the package substrate and the device die; and
   a polymer encircling, and contacting edges of, the package substrate, wherein the polymer extends from a top surface of the package substrate to a level lower than a top surface of the molding compound.

9. The device of claim 8, wherein the polymer and the molding compound comprise different materials.

10. The device of claim 8, wherein the polymer has a density greater than a density of the molding compound.

11. The device of claim 8, wherein the polymer is configured to be dispensed in a form of liquid, and is configured to be cured to a solid form from the liquid.

12. The device of claim 8, wherein the polymer comprises outer edges opposite to inner edges of the polymer that contact the package substrate, and wherein the outer edges of the polymer are aligned to edges of the molding compound.

13. The device of claim 8, wherein the polymer comprises:
    a wide portion extending from a top surface of the package substrate to the level lower than the top surface of the molding compound; and
    a narrow portion narrower than the wide portion extending from a bottom of the wide portion into the molding compound.

14. The device of claim 8, wherein the polymer comprises a solder resist.

15. A device comprising:
    a package substrate;
    a device die underlying and bonded to the package substrate;
    a molding compound under the package substrate, wherein the molding compound is in contact with a bottom surface of the package substrate, and wherein the device die is molded in the molding compound; and
    a polymer ring encircling the package substrate and a top portion of the molding compound, wherein the polymer ring comprises a bottom surface contacting a first top surface of the molding compound.

16. The device of claim 15, wherein the polymer extends from a top surface of the package substrate to a level lower than a second top surface of the molding compound, and wherein the second top surface is in contact with the bottom surface of the package substrate.

17. The device of claim 15, wherein the polymer ring comprises an inner portion forming a first ring, and an outer portion forming a second ring encircling the first ring, and wherein the first ring comprises a first bottom surface, the second ring comprises a second bottom surface, and wherein the first bottom surface of the first ring is unleveled with the second bottom surface of the second ring.

18. The device of claim 15, wherein the polymer and the molding compound comprise different materials.

19. The device of claim 15, wherein the polymer comprises:
    inner edges contacting the package substrate; and
    outer edges opposite to the inner edges, wherein the outer edges of the polymer are aligned to edges of the molding compound.

20. The device of claim 15, wherein the package substrate, the device die, and the molding compound are comprised in a package, and wherein outer edges of the polymer ring forms parts of edges of the package.

* * * * *